United States Patent
Na et al.

(10) Patent No.: US 6,902,989 B2
(45) Date of Patent: Jun. 7, 2005

(54) METHOD FOR MANUFACTURING GALLIUM NITRIDE (GAN) BASED SINGLE CRYSTALLINE SUBSTRATE THAT INCLUDE SEPARATING FROM A GROWTH SUBSTRATE

(75) Inventors: Jeong Seok Na, Seoul (KR); Seung Jin Yoo, Kyungki-do (KR); Young Ho Park, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/622,466

(22) Filed: Jul. 21, 2003

(65) Prior Publication Data
US 2004/0253796 A1 Dec. 16, 2004

(30) Foreign Application Priority Data
Jun. 10, 2003 (KR) ................................ 10-2003-0037030

(51) Int. Cl.[7] .............................................. H01L 21/20
(52) U.S. Cl. ........................ 438/458; 438/459; 438/463; 438/479
(58) Field of Search ................................ 438/458, 459, 438/463, 479, 940, 977

(56) References Cited

U.S. PATENT DOCUMENTS

| | | | | |
|---|---|---|---|---|
| 5,631,190 A | * | 5/1997 | Negley | ........................ 438/33 |
| 6,113,685 A | * | 9/2000 | Wang et al. | .................... 117/3 |
| 6,303,405 B1 | * | 10/2001 | Yoshida et al. | ................ 438/46 |
| 6,365,429 B1 | * | 4/2002 | Kneissl et al. | ................. 438/46 |
| 6,420,242 B1 | * | 7/2002 | Cheung et al. | ............. 438/458 |
| 6,723,165 B2 | * | 4/2004 | Ogawa et al. | ................. 117/95 |
| 6,746,889 B1 | * | 6/2004 | Eliashevich et al. | ........... 438/33 |
| 2003/0003690 A1 | * | 1/2003 | Nering et al. | ................ 438/463 |
| 2003/0114017 A1 | * | 6/2003 | Wong et al. | ................. 438/778 |

FOREIGN PATENT DOCUMENTS

JP    2002222773 A   *   8/2002   ......... H01L/21/268

* cited by examiner

Primary Examiner—Stephen W. Smoot
(74) Attorney, Agent, or Firm—Lowe Hauptman & Berner, LLP

(57) ABSTRACT

A method for manufacturing a gallium nitride (GaN)-based single crystalline substrate includes the steps of (a) forming a GaN-based single crystalline bulk on an upper surface of a growth substrate; (b) forming grooves through the growth substrate so that the growth substrate is patterned and divided into several units by the grooves, each of the grooves having a designated width; and (c) separating the GaN-based single crystalline bulk from the growth substrate by irradiating a laser beam on a lower surface of the growth substrate.

14 Claims, 3 Drawing Sheets

Lapping/Polishing (a)

(b)

METHOD FOR MANUFACTURING GALLIUM NITRIDE (GAN) BASED SINGLE CRYSTALLINE SUBSTRATE THAT INCLUDE SEPARATING FROM A GROWTH SUBSTRATE

BACKGROUND OF THE INVENTION

1. Field of the Invention

The present invention relates to a method for manufacturing a gallium nitride (GaN) based single crystalline substrate, and more particularly to a method for manufacturing a gallium nitride (GaN) based single crystalline substrate using a sapphire substrate.

2. Description of the Related Art

Recently, an optical disk field has been developed to record data at high density and to reproduce data with high resolution. In order to meet these requirements, semiconductor devices, which emit light in a short wavelength band, have been developed. A gallium nitride (GaN) based single crystalline substrate is mainly used as a material for producing these semiconductor devices which emit light in a short wavelength band. A GaN single crystal has an energy band gap of 3.39 eV, thus being suitable for emitting short wavelength blue light.

Till now, GaN based single crystals have been grown on a substrate made of a different material using vapor growth, such as MOCVD (Metal Organic Chemical Vapor Deposition) or HVPE (Hydride Vapor Phase Epitaxy), or MBE (Molecular Beam Epitaxy). Generally, a sapphire ($\alpha$-$Al_2O_3$) substrate or a SiC substrate is used as the substrate. Particularly, the sapphire substrate has a hexagonal structure the same as that of GaN and is cheaper and more stable at a high temperature than the SiC substrate, thus being widely used as the substrate for producing the above semiconductor devices.

However, since a difference between lattice constants of sapphire and GaN is approximately 13% and a difference between thermal coefficients of expansion (TCEs) of sapphire and GaN is approximately −34%, strain is exerted on an interface between the sapphire substrate and the GaN single crystals, thus causing several problems such as lattice defects and cracks in the GaN single crystals. These problems cause difficulty in growing a GaN film of a high quality on the sapphire substrate, and shorten the expected lifetime of a semiconductor device produced on the GaN film.

Accordingly, there is required a method for forming a GaN film on a GaN single crystalline layer using homoepitaxy. However, this GaN single crystalline layer has a high vapor pressure of nitrogen, thus not being able to be used in a conventional method for producing a Si substrate or a GaAs substrate.

Therefore, the GaN based single crystalline layer is obtained by growing a GaN bulk on a growth substrate made of sapphire or SiC using vapor growth such as MOCVD (Metal Organic Chemical Vapor Deposition) or HVPE (Hydride Vapor Phase Epitaxy), or MBE (Molecular Beam Epitaxy). For example, in case that HVPE is used, the GaN bulk can be grown on the growth substrate so that the growth thickness of the GaN bulk is several $\mu$m~ several hundreds $\mu$m per hour. That is, the GaN bulk with a desired thickness can be grown on the growth substrate in a short period of time.

However, in this case, stress is still exerted on both the sapphire substrate and the GaN layer due to the difference between TCEs of sapphire and GaN, thus causing the same problems such as lattice defects and cracks in the GaN based single crystals. In case that strain acting on the sapphire substrate by the GaN layer is less than a yielding point, the GaN layer is not cracked, but is warped toward the sapphire substrate. The warpage of the GaN layer depends on the thickness of the GaN layer. When the thickness of the GaN layer increases, the radius of curvature of the warped GaN layer is reduced and the surface of the warped GaN layer is roughened, thus causing difficulty in polishing the surface of the GaN layer.

In order to solve the above-described problems, there is required a freestanding GaN based substrate. The freestanding GaN based substrate is obtained by growing a GaN based single crystalline bulk on a sapphire substrate and then removing the sapphire substrate from the GaN based single crystalline bulk. Here, the sapphire substrate is removed from the GaN single crystalline bulk by mechanical polishing using diamond powder, chemical etching, or etc.

In case that the sapphire substrate is removed from the GaN single crystalline bulk by the mechanical polishing, stress exerted on the sapphire substrate provided with GaN single crystals grown thereon is in the range of the limit of elasticity of the sapphire substrate. Accordingly, the sapphire substrate is not cracked, but is warped. However, during the progress of the mechanical polishing, the sapphire substrate is reduced in thickness so that equilibrium of strength in the sapphire substrate is lost, thus being cracked. The cracks of the sapphire substrate may be transmitted to the GaN layer, and then the GaN layer may be cracked also. On the other hand, in case that the sapphire substrate is removed from the GaN single crystalline bulk by the chemical etching, it is difficult to obtain an etchant which has a high etching rate and selectively etches the sapphire substrate.

Recently, there is proposed a method for growing a GaN single crystalline bulk on a sapphire substrate using HVPE and then separating the sapphire substrate from the GaN single crystalline bulk using an ultraviolet laser beam. The ultraviolet laser beam passes through the sapphire substrate with a high-energy band gap, and is absorbed by the GaN single crystalline bulk. Thus, this laser beam irradiated onto the lower surface of the sapphire substrate dissolves GaN into nitrogen gas and gallium, thereby separating the sapphire substrate from the GaN single crystalline bulk.

This method for separating the sapphire substrate from the GaN single crystalline bulk by means of the irradiation of the ultraviolet laser beam can be used in a small-sized substrate without causing cracks. However, in case that this method is used in a large-sized substrate with a diameter of more than 2 inches, which is generally required in manufacturing a semiconductor device, cracks form on the substrate.

More specifically, in case that a laser beam is irradiated on the lower surface of a growth substrate 11 made of sapphire or SiC as shown in FIG. 1, since the area of the irradiation of the laser beam is narrow (maximally 10 mm×10 mm until now), the laser beam is sequentially irradiated on limited local areas of the sapphire substrate 11 so that the laser beam can be irradiated on the entire surface of the sapphire substrate 11. Thereby, the level of stress generated by lattice mismatching and a difference between TCEs of the sapphire substrate 11 and a GaN single crystalline bulk 15 grown on the sapphire substrate 11 becomes more serious, thus causing cracks on the GaN single crystalline layer 15. Further, the cracks are propagated into the inside of the GaN single crystalline bulk 15 along cleavages, and then may cleave the GaN single crystalline bulk 15. The GaN single crystalline bulk 15 obtained by the conventional separation method is not suitably used as a substrate for manufacturing a semiconductor device thereon.

Accordingly, there is required a method for manufacturing a GaN single crystalline substrate, in which a GaN single crystalline bulk is grown on a growth substrate and the growth substrate is separated from the GaN single crystalline bulk without damaging the GaN single crystalline bulk.

SUMMARY OF THE INVENTION

Therefore, the present invention has been made in view of the above problems, and it is an object of the present invention to provide a method for manufacturing a GaN based single crystalline substrate, in which a GaN based single crystalline bulk is grown on a growth substrate, grooves are formed through the growth substrate so that the surface of the GaN based single crystalline substrate is exposed to the outside via the grooves, and the growth substrate is separated from the GaN based single crystalline bulk, thus preventing cracks from forming on the GaN based single crystalline bulk due to lattice mismatching and a difference between thermal coefficients of expansion (TCEs) of the sapphire substrate and the GaN based single crystalline bulk.

In accordance with the present invention, the above and other objects can be accomplished by the provision of a method for manufacturing a gallium nitride (GaN) based single crystalline substrate comprising the steps of:

(a) forming AlxGa1-xN (0≦x<1) single crystalline bulk on an upper surface of a growth substrate;

(b) forming grooves through the growth substrate so that the growth substrate is patterned and divided into several units by the grooves, each of the grooves having a designated width; and (c) separating the AlxGa1-xN (0≦x<1) single crystalline bulk from the growth substrate by irradiating a laser beam on a lower surface of the growth substrate.

The GaN based single crystalline bulk may be grown on the upper surface of the growth substrate using vapor deposition such as MOCVD (Metal Organic Chemical Vapor Deposition) or HVPE (Hydride Vapor Phase Epitaxy), or MBE (Molecular Beam Epitaxy). The growth substrate may be a sapphire substrate or a SiC substrate.

Preferably, the method for manufacturing a GaN based single crystalline substrate, after the step (a), may further comprise the step of (a') polishing the growth substrate so that the growth substrate is reduced to a designated thickness, thereby improving working efficiency of the step (b).

Further, preferably, the width of each of the grooves may be at least approximately 10 μm so that the divided patterns of the growth substrate do not contact each other by means of thermal expansion. The step (b) may be achieved using a high-powered laser.

In case that a sapphire substrate is used as the growth substrate, the high-powered laser may preferably output a laser beam with a wavelength of less than approximately 350 nm.

Preferably, the step (c) may be achieved by scanning the lower surface of the growth substrate using the laser beam, and the laser beam irradiated on the lower surface of the growth substrate for separating the GaN single crystalline bulk from the growth substrate may have a wavelength of less than approximately 350 nm.

Further, preferably, the laser used for separating the GaN single crystalline bulk from the growth substrate may be selected from the group consisting of ArF, KrF, XeCl, and Nd:YAG lasers.

Preferably, the step (c) may include the sub-steps of: (c-1) irradiating the laser beam on the lower surface of the growth substrate; and (c-2) heating the growth substrate and the GaN based single crystalline bulk at a temperature of at least 40° C.

Further, preferably, the method for manufacturing a GaN based single crystalline substrate, after the step (c), may further comprise the step of (d) lapping and polishing the surface of the GaN single crystalline bulk from which the growth substrate is separated.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the annexed drawings.

FIGS. 2a to 2d are cross-sectional views showing a method for manufacturing a GaN based single crystalline substrate in accordance with an embodiment of the present invention.

Figure 1:
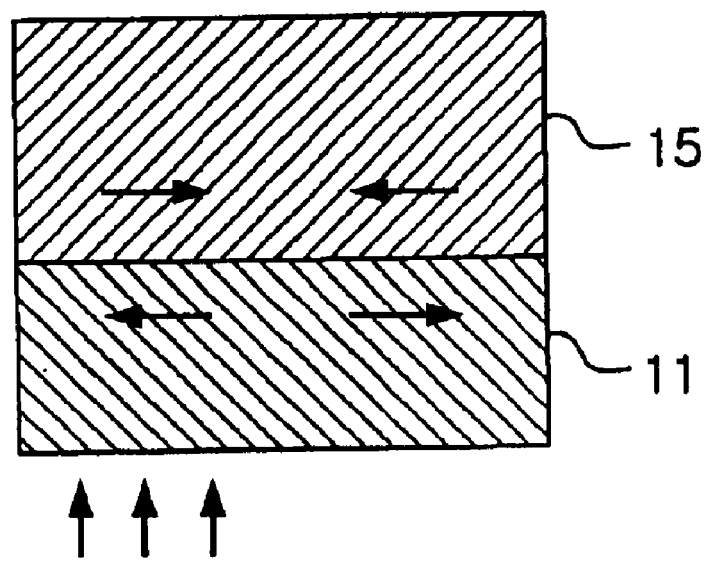
FIG. 1 is a cross-sectional view showing a conventional process for separating a sapphire substrate from a GaN single crystalline bulk using a laser beam.
Figure 2:
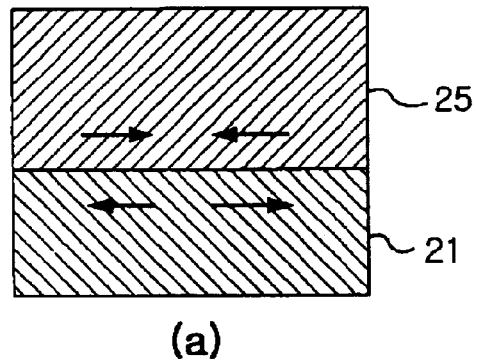
FIGS. 2a to 2d are cross-sectional views showing a method for manufacturing a GaN based single crystalline substrate in accordance with an embodiment of the present invention.
Figure 2:
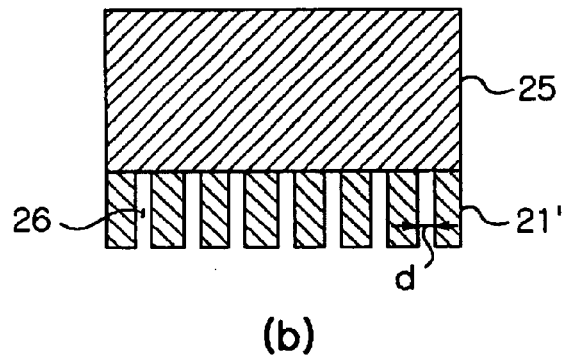
Figure 2:
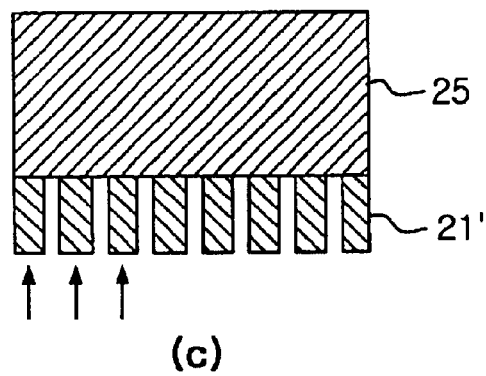
Figure 2:
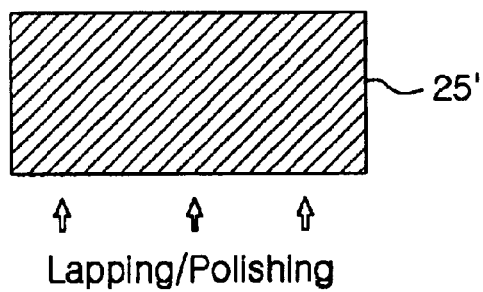

As shown in FIG. 2a, a gallium nitride (GaN) based (e.g. AlxGa1-xN (0≦x<1)) single crystalline bulk 25 is grown on a growth substrate 21. A sapphire substrate or a SiC substrate is used as the growth substrate 21. The GaN based single crystalline bulk 25 is grown to have a thickness suitable for use as a substrate (at least approximately 50 μm) using vapor deposition such as MOCVD (Metal Organic Chemical Vapor Deposition) or HVPE (Hydride Vapor Phase Epitaxy).

Here, lattice mismatching and a difference between thermal coefficients of expansion (TCEs) of the growth substrate 21 and the GaN based single crystalline bulk 25 both occur. For example, in case that a SiC substrate is used as the growth substrate 21, the rate of the lattice mismatching is approximately 3.4% and the difference between TCEs is 25%. On the other hand, in case that a sapphire substrate is used as the growth substrate 21, the rate of the lattice mismatching is approximately 13% and the difference between TCEs is −34%. In this case, as represented by arrows in FIG. 2a, tensile stress and compressive stress are individually exerted on the surfaces of the growth substrate 21 and the GaN based single crystalline bulk 25. As shown in FIG. 2b, the growth substrate 21 is patterned so as to prevent cracks of the GaN based single crystalline bulk 25 generated in a subsequent step of separating the growth substrate 21 from the GaN based single crystalline bulk 25.

With reference to FIG. 2b, a plurality of patterned growth substrates 21' are obtained by forming grooves 26 through the growth substrate 21 so that the surface of the GaN based single crystalline bulk 25 is exposed to the outside via the grooves 26. Preferably, the grooves 26 are formed through the growth substrate 21 using a high-powered laser beam. The growth substrate 21 is divided into a plurality of the patterned growth substrates 21' by the grooves 26, thereby minimizing the level of stress generated due to the lattice mismatching and the difference between TCEs of the patterned growth substrates 21 and the GaN single crystalline bulk 25.

Accordingly, it is possible to prevent cracks from forming in the GaN based single crystalline bulk 25 when the patterned growth substrates 21' are separated from the GaN based single crystalline bulk 25. Here, each of the grooves 26 formed through the growth substrate 21 has a width (d) determined by the size of the used laser beam and the size of the used growth substrate 21, and preferably has a width of at least approximately 10 μm. In case that the width of each of the grooves 26 is not more than 10 μm, the patterned growth substrates 21' contact each other by thermal expansion, thus reducing the prevention of cracks.

The high-powered laser uses a Nd:YAG laser, or etc. Particularly, when the sapphire substrate is patterned, it is preferable to use the laser beam with an energy flux density in the range of approximately 10 J/cm$^2$ to approximately 20 J/cm$^2$. In case that the energy flux density of the laser beam is not more than approximately 10 J/cm$^2$, it is difficult to form the grooves through the sapphire substrate. In case that the energy flux density of the laser beam is not less than approximately 20 J/cm$^2$, the etching rate of the laser beam is excessively high and it is difficult to control the process for minimizing the damage of the laser beam to the GaN based single crystalline bulk 25.

Figure 3:
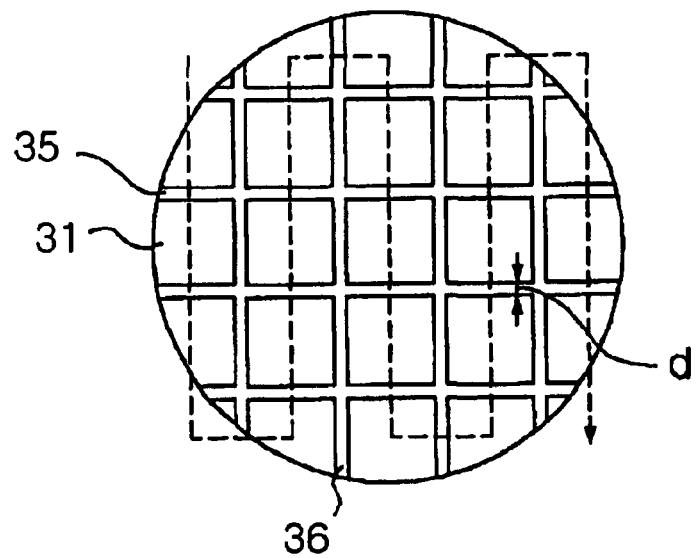
FIGS. 3a and 3b are plan views illustrating a step of irradiating a laser beam for separating a GaN based single crystalline bulk from a growth substrate.
Figure 3:
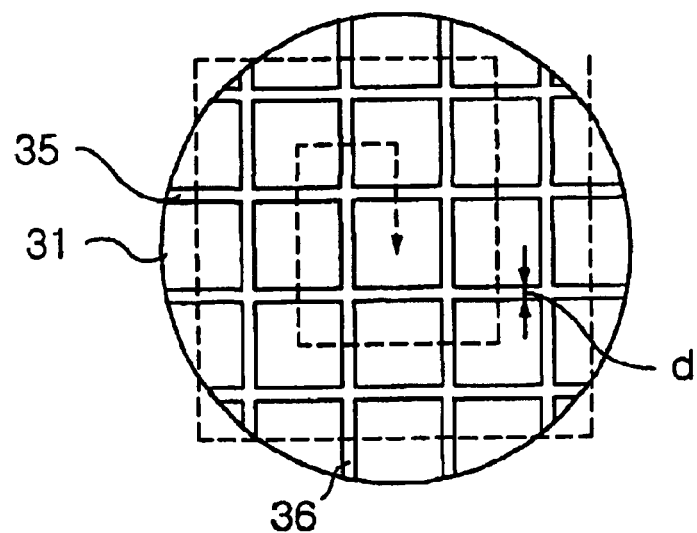

Subsequently, as shown in FIG. 2c, a laser beam is irradiated on the lower surfaces of the patterned growth substrates 21' divided by the grooves 26, thus separating the GaN based single crystalline bulk 25 from the patterned growth substrates 21'. Preferably, the laser beam uses a wavelength of less than approximately 350 nm so that the laser beam can pass through the sapphire substrate used as the patterned growth substrates 21'. Here, the laser is selected from the group consisting of ArF, KrF, XeCl, and Nd:YAG lasers. This step of separating the GaN based single crystalline bulk 25 from the patterned growth substrates 21' is achieved by scanning the lower surfaces of the patterned growth substrates 21' with the laser beam. With reference to FIGS. 3a and 3b, this laser beam irradiation step will be described in detail later.

Alternatively, this step of separating the GaN based single crystalline bulk 25 from the patterned growth substrates 21' includes laser-beam irradiating and heating. Here, the surface of the GaN based single crystalline bulk 25 contacting the patterned growth substrates 21' is dissolved into gallium (Ga) and nitrogen (N$_2$) by irradiating an ultraviolet laser beam with a wavelength of less than 350 nm on the lower surface of the patterned growth substrates 21', as shown in the following equation.

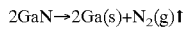

2GaN→2Ga(s)+N$_2$(g)↑

Next, the patterned growth substrates 21' and the GaN based single crystalline bulk 25 are heated at a temperature of at least 40° C., so that the patterned growth substrates 21' are separated from the GaN based single crystalline bulk 25 by melting gallium in a solid state. Here, the patterned growth substrates 21' separated from the GaN based single crystalline bulk 25 may be independently used as a substrate for manufacturing a semiconductor device.

Conventionally, the GaN based single crystalline bulk could be cracked due to stress generated in this step of separating the growth substrate from the GaN based single crystalline bulk. However, in the present invention, the growth substrate 21 is patterned and divided into a plurality of patterned growth substrates 21', thereby reducing the size of a contact area between each of the patterned growth substrates 21' and the GaN based single crystalline bulk 25. Therefore, the reduced contact area between each of the patterned growth substrates 21' and the GaN based single crystalline bulk 25 decreases the level of stress exerted on the interface therebetween, and minimizes the occurrence of cracks on the GaN based single crystalline bulk 25.

Further, in this embodiment of the present invention, there may be selectively performed a step of lapping and polishing the lower surface of the GaN based single crystalline bulk 25 separated from the patterned growth substrates 21'. With reference to FIG. 2d, the lower surface of the GaN based single crystalline substrate is mirror-like finished by lapping and polishing, thereby producing a mirror-like finished GaN based single crystalline bulk 25'. When the grooves 26 are formed through the growth substrate 21 as shown in FIG. 2b, the lower surface of the GaN based single crystalline bulk 25 may be damaged. Accordingly, as shown in FIG. 2d, it is preferable to additionally perform a lapping step, in which the damaged lower surface of the GaN based single crystalline bulk 25 is removed and then the lower surface of the GaN based single crystalline bulk 25 is lapped so that the lower surface is planarized, and a polishing step, in which the lower surface of the GaN based single crystalline bulk 25' is mirror-like finished.

The method for manufacturing the GaN based single crystalline substrate in accordance with the present invention may further comprises a polishing step of reducing the thickness of the growth substrate 21 after the step of growing the GaN based single crystalline bulk 25 on the growth substrate 21 and before the step of patterning the growth substrate 21. Since the growth substrate 21 is made of a material with a large hardness such as a sapphire substrate or a SiC substrate, the thickness of the growth substrate 21 is reduced in advance by the above polishing step, thereby increasing the efficiency of the subsequent patterning step.

FIGS. 3a and 3b are plan views illustrating a laser beam-irradiating step for separating a GaN based single crystalline substrate from a growth substrate. As described above, the laser beam-irradiating step for separating a GaN based single crystalline bulk 35 from a growth substrate 31 is performed by scanning the lower surface of the growth substrate 31 with a laser beam. The laser beam scanning may be performed by various methods as shown in FIGS. 3a and 3b.

FIGS. 3a and 3b show the patterned growth substrates 31 and the GaN based single crystalline bulk 35 after the patterning step shown in FIG. 2b. Here, the pattern of grooves (d) on the growth substrate is formed in a crisscross pattern, thereby dividing the growth substrate 31 into plural units formed in regular square shapes. Arrows in FIGS. 3a and 3b represent laser beam scanning routes in the laser beam-irradiating step.

In FIG. 3a, the laser beam irradiating is performed by scanning the lower surfaces of the patterned growth substrates 31 along the route reciprocating in a row of the patterns from the left side to the right side or from the right side to the left side. On the other hand, in FIG. 3b, the laser beam irradiating is performed by scanning the lower surfaces of the patterned growth substrates 31 along the route traveling in a spiral line from the outside to the inside.

Since the scanning methods shown in FIGS. 3a and 3b are exemplary, those skilled in the art will appreciate that various modifications, in which a laser beam is irradiated all over the patterned growth substrates, are possible.

As apparent from the above description, the present invention provides a method for manufacturing a GaN based single crystalline substrate, in which a GaN based single crystalline bulk is grown on a growth substrate, grooves are formed through the growth substrate so that the surface of the GaN based single crystalline substrate is exposed to the outside via the grooves, and the growth substrate is separated from the GaN based single crystalline bulk, thus reducing the size of a contact area between the growth substrate and the GaN based single crystalline bulk and preventing stress occurring due to lattice mismatching and a difference between thermal coefficients of expansion (TCEs) of the growth substrate and the GaN based single crystalline bulk. Accordingly, the method of the present invention is used to manufacture a GaN based single crystalline substrate with a large diameter of more than 2 inches without causing cracks.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a gallium nitride (GaN)-based single crystalline substrate comprising the steps of:
   (a) forming a GaN-based single crystalline bulk on an upper surface of a growth substrate;
   (b) forming grooves through the growth substrate so that the growth substrate is patterned and divided into several units by the grooves, each of said grooves having a designated width; and
   (c) separating the GaN-based single crystalline bulk from the growth substrate by irradiating a laser beam on a lower surface of the growth substrate.

2. The method for manufacturing a GaN-based single crystalline substrate as set forth in claim 1,
   wherein the GaN-based single crystalline bulk is grown on the upper surface of the growth substrate using vapor deposition such as MOCVD (Metal Organic Chemical Vapor Deposition) or HVPE (Hydride Vapor Phase Epitaxy).

3. The method for manufacturing a GaN-based single crystalline substrate as set forth in claim 1,
   wherein the growth substrate is a sapphire substrate or a SiC substrate.

4. The method for manufacturing a GaN-based single crystalline substrate as set forth in claim 1, after the step (a), further comprising the step of (a') polishing the growth substrate so that the growth substrate is reduced to a designated thickness.

5. The method for manufacturing a GaN-based single crystalline substrate as set forth in claim 1,
   wherein the width of each of the grooves is at least approximately 10 $\mu$m.

6. The method for manufacturing a GaN-based single crystalline substrate as set forth in claim 1,
   wherein the step (b) is achieved using a high-powered laser.

7. The method for manufacturing a GaN-based single crystalline substrate as set forth in claim 6,
   wherein the high-powered laser outputs a laser beam with a wavelength of less than approximately 350 nm.

8. The method for manufacturing a GaN-based single crystalline substrate as forth in claim 1,
   wherein the step (c) is achieved by scanning the lower surface of the growth substrate using the laser beam.

9. The method for manufacturing a GaN-based single crystalline substrate as set forth in claim 1, wherein the laser beam irradiated on the lower surface of the growth substrate for separating the GaN-based single crystalline bulk from the growth substrate has a wavelength of less than approximately 350 nm.

10. The method for manufacturing a GaN-based single crystalline substrate as set forth in claim 1, wherein the laser used for separating the GaN-based single crystalline bulk from the growth substrate is selected from the group consisting of ArF, KrF, XeCl, and Nd:YAG lasers.

11. The method for manufacturing a GaN-based single crystalline substrate as set forth in claim 1,
    wherein the step (c) includes the sub-steps of:
    (c-1) irradiating the laser beam on the lower surface of the growth substrate; and
    (c-2) heating the growth substrate and the GaN-based single crystalline bulk at a temperature of at least 40° C.

12. The method for manufacturing a GaN-based single crystalline substrate as set forth in claim 1, after the step (c), further comprising the step of (d) lapping and polishing the surface of the GaN-based single crystalline bulk from which the growth substrate is separated.

13. The method for manufacturing a GaN-based single crystalline substrate as set forth in claim 1, wherein the GaN-based single crystalline bulk is a AlxGa1-xN (0<x<1) single crystalline bulk.

14. The method for manufacturing a GaN-based single crystalline substrate as set forth in claim 1, wherein the GaN-based single crystalline bulk is a AlxGa1-xN (0≦x<1) single crystalline bulk.

* * * * *